United States Patent
Lin et al.

(10) Patent No.: US 9,842,531 B2
(45) Date of Patent: Dec. 12, 2017

(54) GATE DRIVING CIRCUIT AND DISPLAY DEVICE

(71) Applicants: HannStar Display (Nanjing) Corporation, Nanjing (CN); HannStar Display Corporation, Taipei (TW)

(72) Inventors: Sung-Chun Lin, Tainan (TW); Hsuan-Chen Liu, Kaohsiung (TW); Chien-Ting Chan, Tainan (TW)

(73) Assignees: HannStar Display (Nanjing) Corporation, Nanjing (CN); HannStar Display Corporation, Taipei (TW)

( * ) Notice: Subject to any disclaimer, the term of this patent is extended or adjusted under 35 U.S.C. 154(b) by 0 days.

(21) Appl. No.: 15/098,335

(22) Filed: Apr. 14, 2016

(65) Prior Publication Data
US 2016/0335949 A1    Nov. 17, 2016

(30) Foreign Application Priority Data
May 13, 2015   (CN) .......................... 2015 1 0242906

(51) Int. Cl.
| G09G 3/36 | (2006.01) |
| G09G 3/20 | (2006.01) |
| G11C 19/00 | (2006.01) |
| G06F 1/04 | (2006.01) |
| G09G 5/14 | (2006.01) |
| G11C 19/28 | (2006.01) |
| G09G 3/3266 | (2016.01) |

(52) U.S. Cl.
CPC .............. *G09G 3/2085* (2013.01); *G06F 1/04* (2013.01); *G09G 3/20* (2013.01); *G09G 3/2092* (2013.01); *G09G 3/3266* (2013.01); *G09G 3/3677* (2013.01); *G09G 5/14* (2013.01); *G11C 19/00* (2013.01); *G11C 19/28* (2013.01); *G09G 2310/0213* (2013.01); *G09G 2310/0243* (2013.01); *G09G 2310/0283* (2013.01); *G09G 2310/0286* (2013.01); *G09G 2310/08* (2013.01); *G09G 2330/021* (2013.01)

(58) Field of Classification Search
CPC ........... G11C 19/00; G06F 3/038; G09G 5/00; G09G 3/36; G02F 1/1345
See application file for complete search history.

(56) References Cited

U.S. PATENT DOCUMENTS

| 8,531,224 B2 | 9/2013 | Iwamoto et al. |
| 2007/0001991 A1* | 1/2007 | Jang ..................... G09G 3/3677 345/100 |

(Continued)

*Primary Examiner* — Pegeman Karimi
(74) *Attorney, Agent, or Firm* — CKC & Partners Co., Ltd.

(57) ABSTRACT

The invention discloses a gate driving circuit and a display device. The gate driving circuit includes first to eighth dock signal lines and first to $N^{th}$ stage first shift registers, where N is an integer greater than or equal to 9. The first to eighth clock signal lines are configured to provide first to eighth clock signals, respectively. The $i^{th}$ stage first shift register is coupled to one of the first to eighth clock signal lines and receives one of the first to eighth clock signals, a first input signal and a second input signal and outputs an $i^{th}$ stage first output signal, where i is any integer from 1 to N.

15 Claims, 7 Drawing Sheets

(56) References Cited

U.S. PATENT DOCUMENTS

| | | | |
|---|---|---|---|
| 2007/0075954 A1* | 4/2007 | Oh | G09G 3/3258 345/92 |
| 2008/0001904 A1* | 1/2008 | Kim | G09G 3/3677 345/100 |
| 2010/0231497 A1* | 9/2010 | Liao | G09G 3/3677 345/100 |
| 2011/0002438 A1* | 1/2011 | Kim | G11C 19/28 377/67 |
| 2014/0355732 A1* | 12/2014 | Lin | G06F 3/041 377/64 |
| 2016/0240145 A1* | 8/2016 | Jeong | G09G 3/3233 |

* cited by examiner

GATE DRIVING CIRCUIT AND DISPLAY DEVICE

RELATED APPLICATIONS

This application claims priority to Chinese Patent Application Serial Number 201510242906.9, filed on May 13, 2015, which is herein incorporated by reference.

BACKGROUND

Field of the Invention

The present invention relates to a gate driving circuit and a display device, and more particularly to a gate driving circuit and a display device which can improve driving efficiency and reduce power consumption.

Description of Related Art

A flat panel display device, such as a liquid crystal display (LCD) device or an organic light-emitting diode (OLED) display device, generally has a lot of shift registers for controlling gray levels of all pixels displayed in the display device at the same time point. However, for a high definition (HD) display device or an ultra HD display device, the gate driver is in charge of driving more pixels, resulting in over resistance-capacitance (RC) loading of the clock signal lines of the gate driver, thus causing too much power consumption and poor driving efficiency, leading to degradation of display quality.

SUMMARY OF THE INVENTION

An objective of the present invention is to provide a gate driving circuit and a display device for reducing RC loading, thereby improving driving efficiency and reducing delay and power consumption.

One aspect of the present invention is directed to a gate driving circuit which includes first to eighth clock signal lines and first $1^{st}$ to $N^{th}$ stage shift registers, where N is an integer greater than or equal to 9. The first to eighth clock signal lines are configured to provide first to eighth clock signals, respectively. The first $i^{th}$ stage shift register is coupled to one of the first to eighth clock signal lines and receives one of the first to eighth clock signals, a first input signal and a second input signal and outputs a first $i^{th}$ stage output signal, where i is any integer from 1 to N.

In one embodiment of the present invention, when i is any integer from 1 to 4, the first input signal is a starting signal, and the second input signal is a first $(i+4)^{th}$ stage output signal outputted by the first $(i+4)^{th}$ stage shift register.

In one embodiment of the present invention, when i is any integer from 5 to (N−4), the first input signal is a first $(i-4)^{th}$ stage output signal outputted by the first $(i-4)^{th}$ stage shift register, and the second input signal is a first $(i+4)^{th}$ stage output signal outputted by the first $(i+4)^{th}$ stage shift register.

In one embodiment of the present invention, when i is any integer from (N−3) to N, the first input signal is a first $(i-4)^{th}$ stage output signal outputted by the first $(i-4)^{th}$ stage shift register, and the second input signal is an ending signal.

In one embodiment of the present invention, the first to eighth clock signals have substantially the same clock period, a high level duration and a low level duration in the clock period are substantially the same, and the $(j+1)^{th}$ clock signal of the first to eighth clock signals lags the $j^{th}$ clock signal of the clock signals by substantially ⅛ clock period, where j is an integer less than 8.

In one embodiment of the present invention, N is a multiple of 8.

In one embodiment of the present invention, the gate driving circuit further includes ninth to sixteenth clock signal lines and second $1^{st}$ to $N^{th}$ stage shift registers. The ninth to sixteenth clock signal lines are configured to provide the first to eighth clock signals, respectively. The second $i^{th}$ stage shift register is coupled to one of the ninth to sixteenth clock signal lines and receives one of the first to eighth clock signals, a third input signal and a fourth input signal and outputs a second $i^{th}$ stage output signal, where the second $i^{th}$ stage output signal is substantially the same as the first $i^{th}$ stage output signal.

In one embodiment of the present invention, when i is any integer from 1 to 4, the third input signal is a starting signal, and the fourth input signal is a second $(i+4)^{th}$ stage output signal outputted by the second $(i+4)^{th}$ stage shift register.

In one embodiment of the present invention, when is any integer from 5 to (N−4), the third input signal is a second $(i-4)^{th}$ stage output signal outputted by the second $(i-4)^{th}$ stage shift register, and the fourth input signal is a second $(i+4)^{th}$ stage output signal outputted by the second $(i+4)^{th}$ stage shift register.

In one embodiment of the present invention, when i is any integer from (N−3) to N, the third input signal is a second $(i-4)^{th}$ stage output signal outputted by the second $(i-4)^{th}$ stage shift register, and the fourth input signal is an ending signal.

Another aspect of the present invention is directed to a display device. The display device includes a display panel and a driving circuit. The display panel has a first side and a second side opposite to each other. The driving circuit is configured to drive the display panel and includes first to sixteenth clock signal lines and $1^{st}$ to $N^{th}$ stage shift registers, where N is an integer greater than or equal to 17. The first to sixteenth clock signal lines are configured to provide first to sixteenth clock signals, respectively. The $i^{th}$ stage shift register is coupled to one of the first to sixteenth clock signal lines and receives one of the first to sixteenth clock signals, a first input signal and a second input signal and outputs an $i^{th}$ stage output signal, where i is any integer from 1 to N. The driving circuit is divided into a first gate driving circuit and a second gate driving circuit. The first gate driving circuit has the odd-numbered clock signal lines and the odd-numbered stage shift registers, the second gate driving circuit has the even-numbered clock signal lines and the even-numbered stage shift registers, and the first gate driving circuit and the second gate driving circuit are disposed at the first side and the second side of the display panel, respectively.

In one embodiment of the present invention, when i is any integer from 1 to 8, the first input signal is a starting signal, and the second input signal is an $(i+8)^{th}$ stage output signal outputted by the $(i+8)^{th}$ stage shift register.

In one embodiment of the present invention, when i is any integer from 9 to (N−8), the first input signal is an $(i-8)^{th}$ stage output signal outputted by the $(i-8)^{th}$ stage shift register, and the second input signal is an $(i+8)^{th}$ stage output signal outputted by the $(i+8)^{th}$ stage shift register.

In one embodiment of the present invention, when i is any integer from (N−7) to N, the first input signal is an $(i-8)^{th}$ stage output signal outputted by the $(i-8)^{th}$ stage shift register, and the second input signal is an ending signal.

In one embodiment of the present invention, the first to sixteenth clock signals have substantially the same clock period, a high level duration and a low level duration in the clock period are substantially the same, and the $(j+1)^{th}$ clock signal of the first to sixteenth clock signals lags the $j^{th}$ clock signal of the clock signals by substantially 1/16 clock period, where j is an integer less than 16.

In one embodiment of the present invention, N is a multiple of 16.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION OF THE INVENTION

The detailed explanation of the present invention is described as following. The described preferred embodiments are presented for purposes of illustrations and description, and they are not intended to limit the scope of the present invention.

Figure 1:
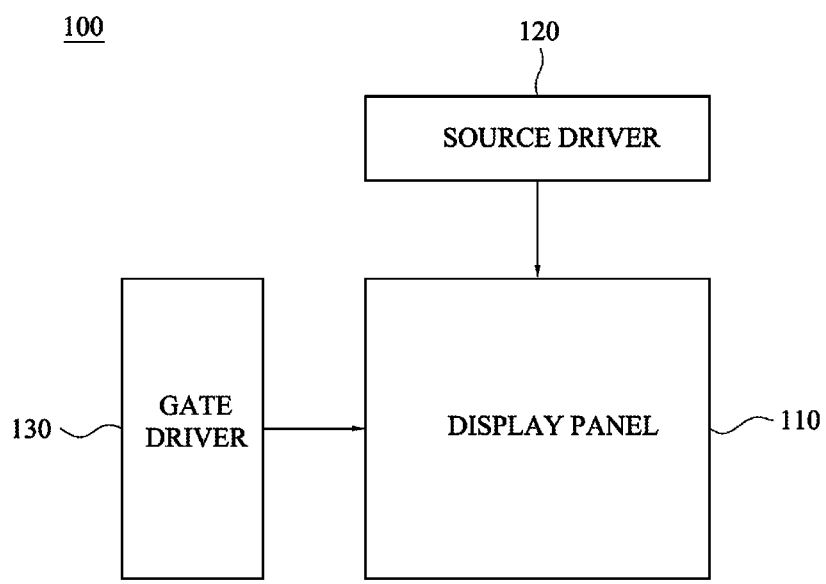
FIG. 1 is a schematic diagram of a display device.

Please refer to FIG. 1, which is a schematic diagram of a display device 100. The display device 100 includes a display panel 110, a source driver 120 and a gate driver 130. The display panel 110 includes pixels arranged in a matrix for collectively displaying an image. The display panel 110 may be, for example, a liquid crystal display (LCD) panel of twisted nematic (TN) mode, in-plane switching (IPS) mode, fringe-field switching (FFS) mode, vertical alignment (VA) mode or other different modes, or an organic light-emitting diode (OLED) display panel. The source driver 120 is electrically connected to the display panel 110, configured to convert image data into source driving signals and transmit the source driving signals to the display panel 110. The gate driver 130 is configured to generate and transmit gate driving signals to the display panel 110. The display panel 110 displays an image by the driving of the source driving signals and the gate driving signals.

Figure 2:
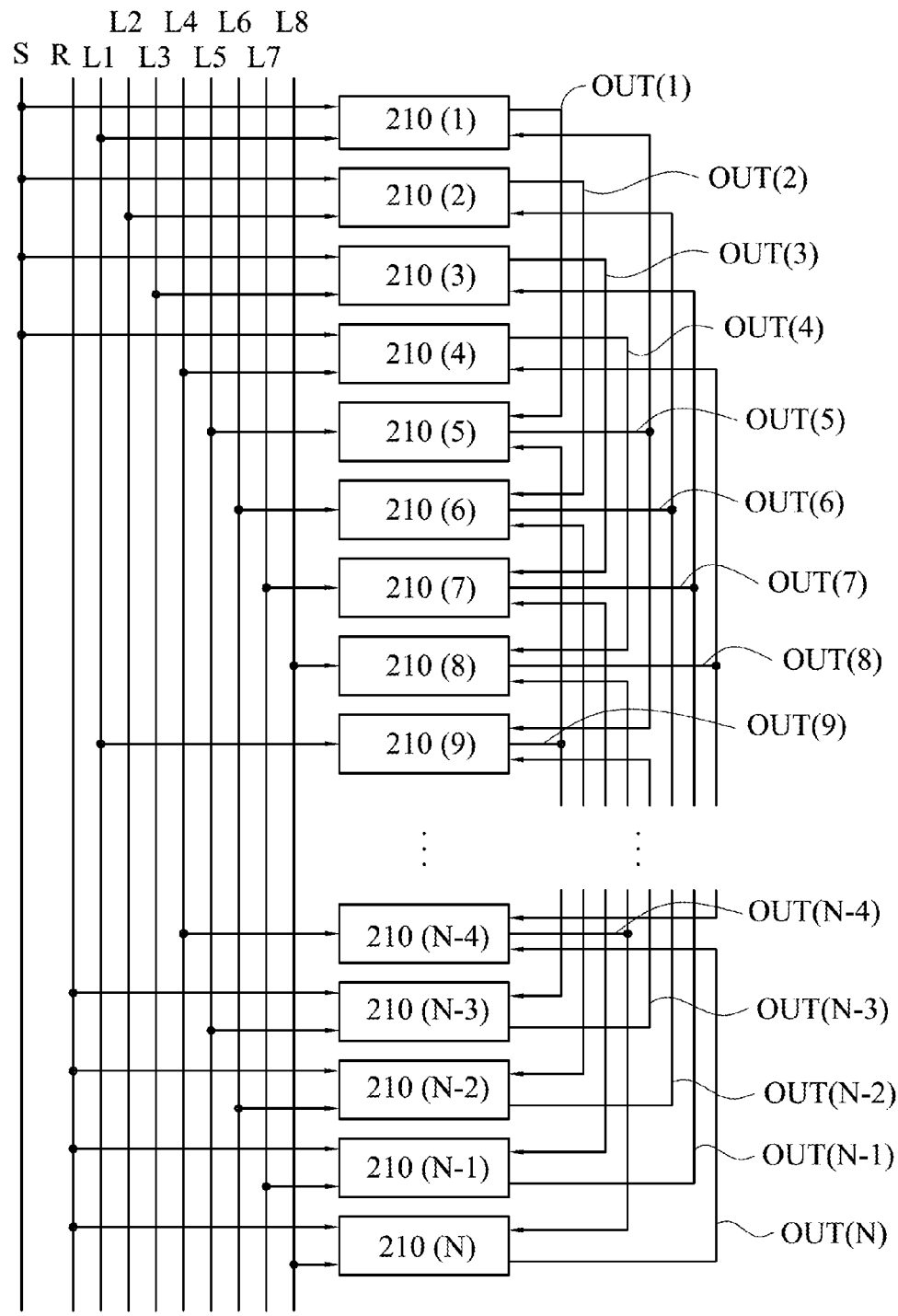
FIG. 2 is schematic diagram of a gate driving circuit in accordance with a first embodiment of the present invention.

Please refer to FIG. 2, which is a schematic diagram of a gate driving circuit 200 in accordance with a first embodiment of the present invention. The gate driving circuit 200 is adapted to the display device 100 of FIG. 1 or other similar display device. In the following, the display device 100 of FIG. 1 is exemplified for description. The gate driving circuit 200 is a part of the gate driver 130. The gate driving circuit 200 includes clock signal lines L1-L8, a starting signal line S, an ending signal line R and N stage shift registers 210(1)-210(N), where N is an integer greater than or equal to 9. In some embodiments, N is a multiple of 8. The clock signal lines L1-L8 are configured to provide clock signals C1-C8 to the corresponding shift registers 210(1)-210(N). In FIG. 2, the clock signal lines L1-L8 respectively provide the clock signals C1-C8 to the corresponding shift registers 210(1)-210(N). In addition, the starting signal line S provides a starting signal STV to the 1$^{st}$ to 4$^{th}$ stage shift registers 210(1)-210(4), and the ending signal line R provides an ending signal RSTV to the (N−3)$^{th}$ to N$^{th}$ stage shift registers 210(N−3)-210(N). The shift registers 210(1)-210(N) respectively generates output signals OUT(1)-OUT(N). The output signals OUT(1)-OUT(4) are respectively inputted to the fifth to eighth stage shift registers 210(5)-210(8), the output signals OUT(N−3)-OUT(N) are respectively inputted to the (N−7)$^{th}$ to (N−4)$^{th}$ stage shift registers 210(N−7)-210(N−4), and each of the other output signals OUT(5)-OUT(N−4) is inputted to the shift registers fourth previous thereto and fourth next thereto. For illustration, the output signal OUT(5) is inputted to the 1$^{st}$ stage shift register 210(1) and the 9$^{th}$ stage shift register 210(9).

Figure 3:
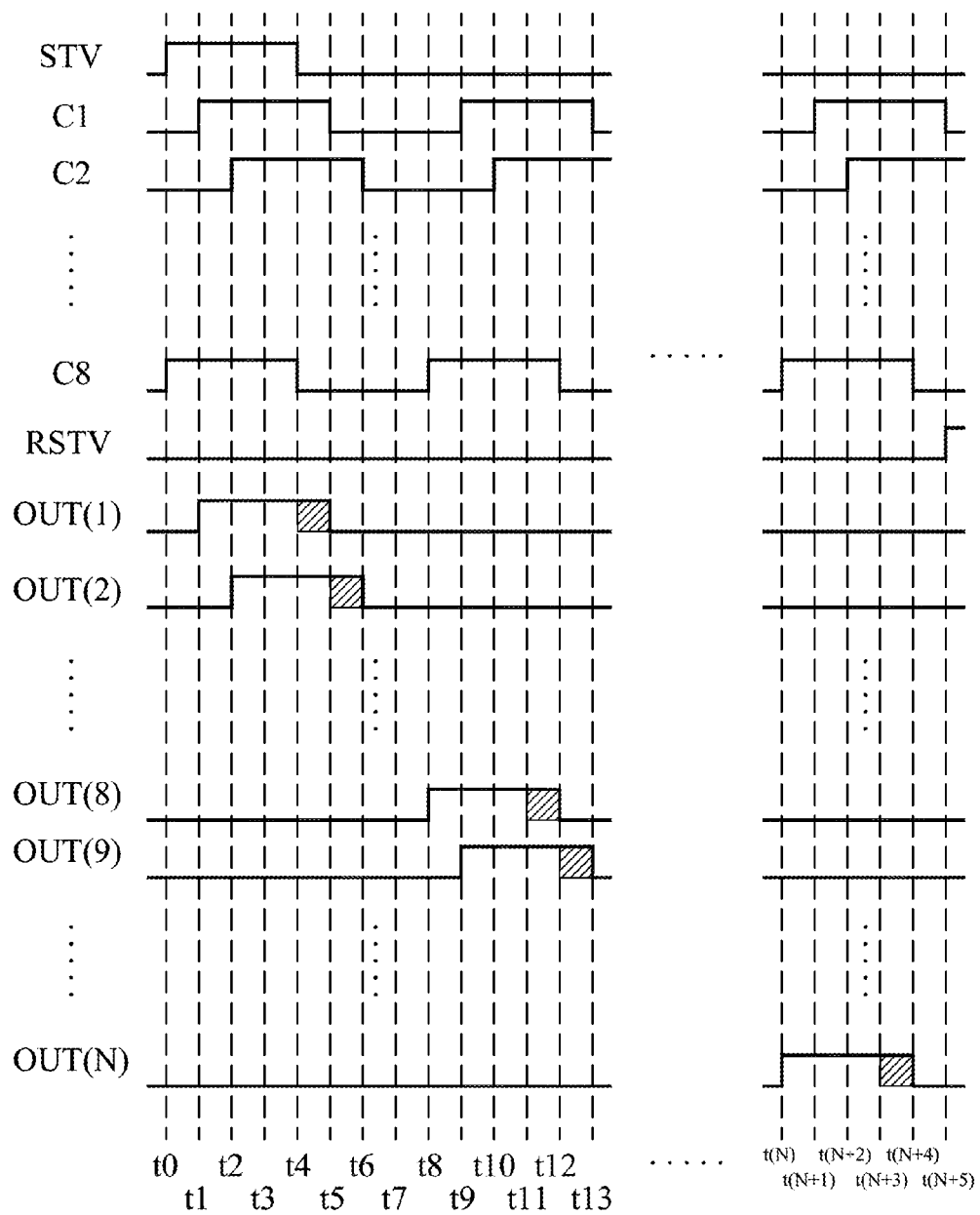
FIG. 3 is a time sequential diagram of the gate driving circuit of FIG. 2.

Please refer to FIG. 3, which is a time sequential diagram of the gate driving circuit 200 of FIG. 2. As shown in FIG. 3, at time point t0, the starting signal STV rises to a high level, and then the clock signals C1-C8 sequentially rise to a high level at time points t1-t8, such that the output signals OUT(1)-OUT(8) sequentially rise to a high level at time points t1-t8. The clock signals C1-C8 sequentially fall to a low level at time points t5-t12, such that the output signals OUT(1)-OUT(8) sequentially fall to a low level at time points t5-t12. The clock signals C1-C8 have the same clock period, and the high level duration and the low level duration in each clock period are the same. The clock signal C2 lags the clock signal C1 by 1/8 clock period, the clock signal C3 lags the clock signal C2 by 1/8 clock period, and the like. Similarly, the clock signals C1-C8 sequentially rise to a high level at time points t9-t16, such that the output signals OUT(9)-OUT(16) sequentially rise to a high level at time points t9-t16. The clock signals C1-C8 sequentially fall to a low level at time points t13-t20, such that the output signals OUT(9)-OUT(16) sequentially fall to a low level at time points t13-t20. The output signals OUT(1)-OUT(N) respectively switch to a high level and a low level at specific time points in accordance with the aforementioned rule for driving the corresponding pixels of the display panel 110. Then, the ending signal RSTV rises to a high level at time point t(N+5), and the current driving stage ends.

It is noted that, for each of the output signals OUT(1)-OUT(N), the duration for driving the display panel 110 (the shaded part in FIG. 3) occupies 1/4 of the high level duration. In comparison with a gate driving circuit using four clock signal lines, in the embodiment of the gate driving circuit 200, the output signals OUT(1)-OUT(N) have longer pre-charge time, and thus the driving efficiency of the gate driving circuit 200 to the display panel can be enhanced. In addition, the gate driving circuit 200 can reduce the resistance and the capacitance of the clock signal lines L1-L8 by half, and the RC loading is reduced accordingly, thereby improving driving efficiency and reducing delay and power consumption caused by excessive RC loading.

Figure 4:
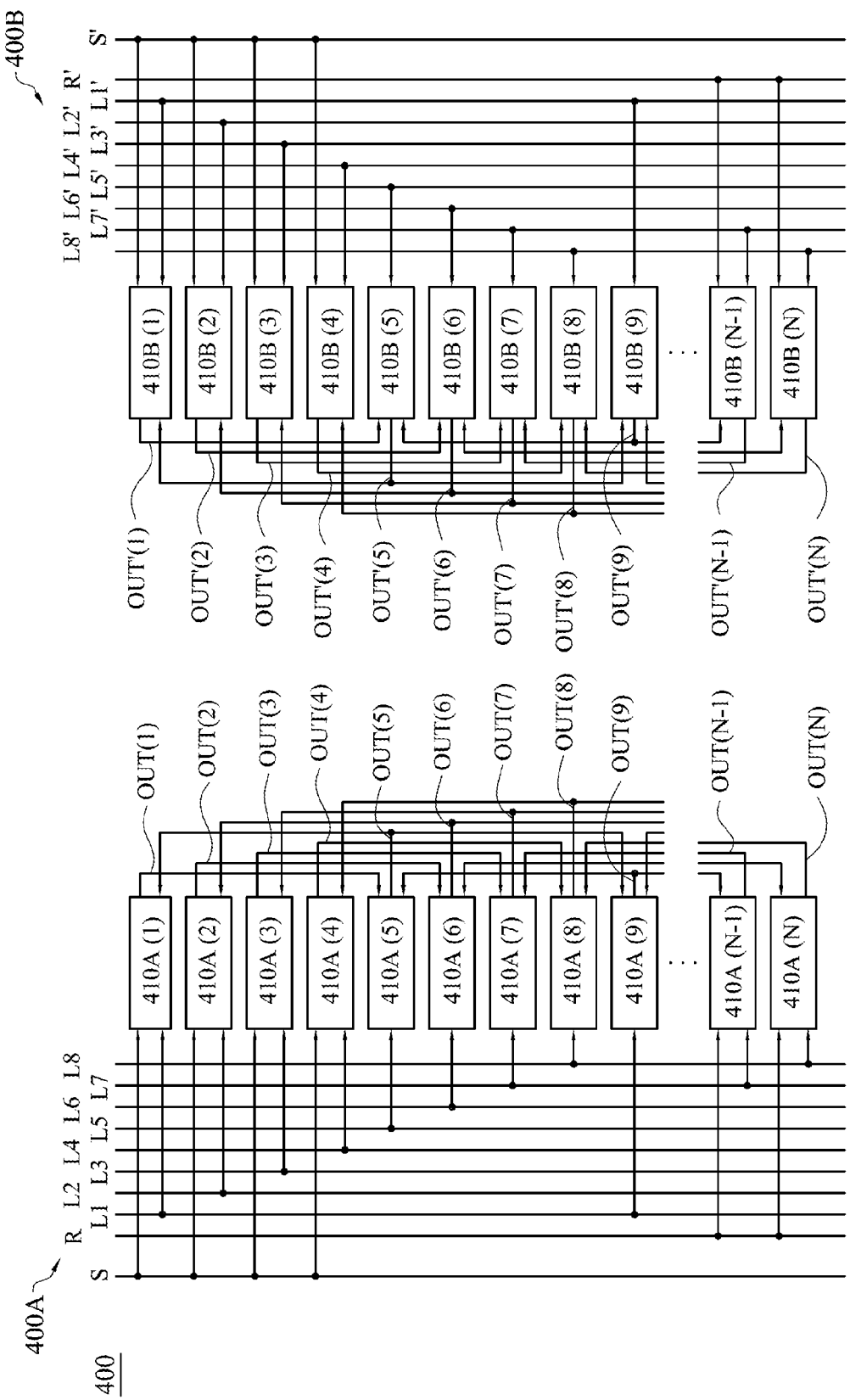
FIG. 4 is a schematic diagram of a gate driving circuit in accordance with a second embodiment of the present invention.

The concept of the aforementioned embodiments may also be applied to a display device which is driven simultaneously at left and right sides. Please refer to FIG. 4, which is a schematic diagram of the gate driving circuit 400 in accordance with a second embodiment of the present invention. The gate driving circuit 400 is adapted to the display device 100 of FIG. 1 or another similar display device. In the following, the display device 100 of FIG. 1 is exemplified for description.

The gate driving circuit 400 is a part of the gate driver 130, and is divided into a first gate driving circuit 400A and a second gate driving circuit 400B. The first gate driving circuit 400A includes clock signal lines L1-L8, a starting signal line S, an ending signal line R and first N stage shift registers 410A(1)-410A(N), and the second gate driving circuit 400B includes clock signal lines LV-L8', a starting signal line S', an ending signal line R' and second N stage shift registers 410B(1)-410B(N), where N is an integer greater than or equal to 9. In some embodiments, N is a multiple of 8. The clock signal lines L1-L8 provide clock signals C1-C8 to the corresponding first shift registers 410A(1)-410A(N), respectively, and the clock signal lines L1'-L8' provide the clock signals C1-C8 to the corresponding second shift registers 410B(1)-410B(N), respectively. In addition, the starting signal line S provides a starting signal STV to the first $1^{st}$ to $4^{th}$ stage shift registers 410A(1)-410A(4), the starting signal line S' provides the starting signal STV to the second $1^{st}$ to $4^{th}$ stage shift registers 410B(1)-410B(4), the ending signal line R provides an ending signal RSTV to the first $(N-3)^{th}$ to $N^{th}$ stage shift registers 410A(N-3)-410A(N), and the ending signal line R' provides the ending signal RSTV to the second $(N-3)^{th}$ to $N^{th}$ stage shift registers 410B(N-3)-410B(N). The first shift registers 410A(1)-410A(N) respectively generate first output signals OUT(1)-OUT(N), and the second shift registers 410B(1)-410B(N) respectively generate second output signals OUT'(1)-OUT'(N). The first output signal OUT(i) is the same as the second output signal OUT'(i). For illustration, the first $1^{st}$ stage output signal OUT(1) and the second $1^{st}$ stage output signal OUT'(1) are the same, and the first $2^{nd}$ stage output signal OUT(2) and the second $2^{nd}$ stage output signal OUT(2) are the same. The driving method of the first gate driving circuit 400A and the second gate driving circuit 400B is the same as that of the gate driving circuit 200, and the sequential diagram thereof may be referred to FIG. 3 and is not described again herein.

The first output signals OUT(1)-OUT(N) and the second output signals OUT'(1)-OUT'(N) are inputted to the left and right sides of the display panel 110, respectively. In some embodiments, the first gate driving circuit 400A and the second gate driving circuit 400B are disposed at the left and right sides of the display panel 110, respectively. With the gate driving circuit 400 of FIG. 4, the driving efficiency of the display device 100 can be enhanced.

It is noted that the first gate driving circuit 400A and the second gate driving circuit 400B may alternatively be in different gate drivers. For example, for a display device with two gate drivers at the left and right sides thereof, the first gate driving circuit 400A is a part of one of the gate drivers, while the second gate driving circuit 400B is a part of the other one of the gate drivers.

Figure 5:
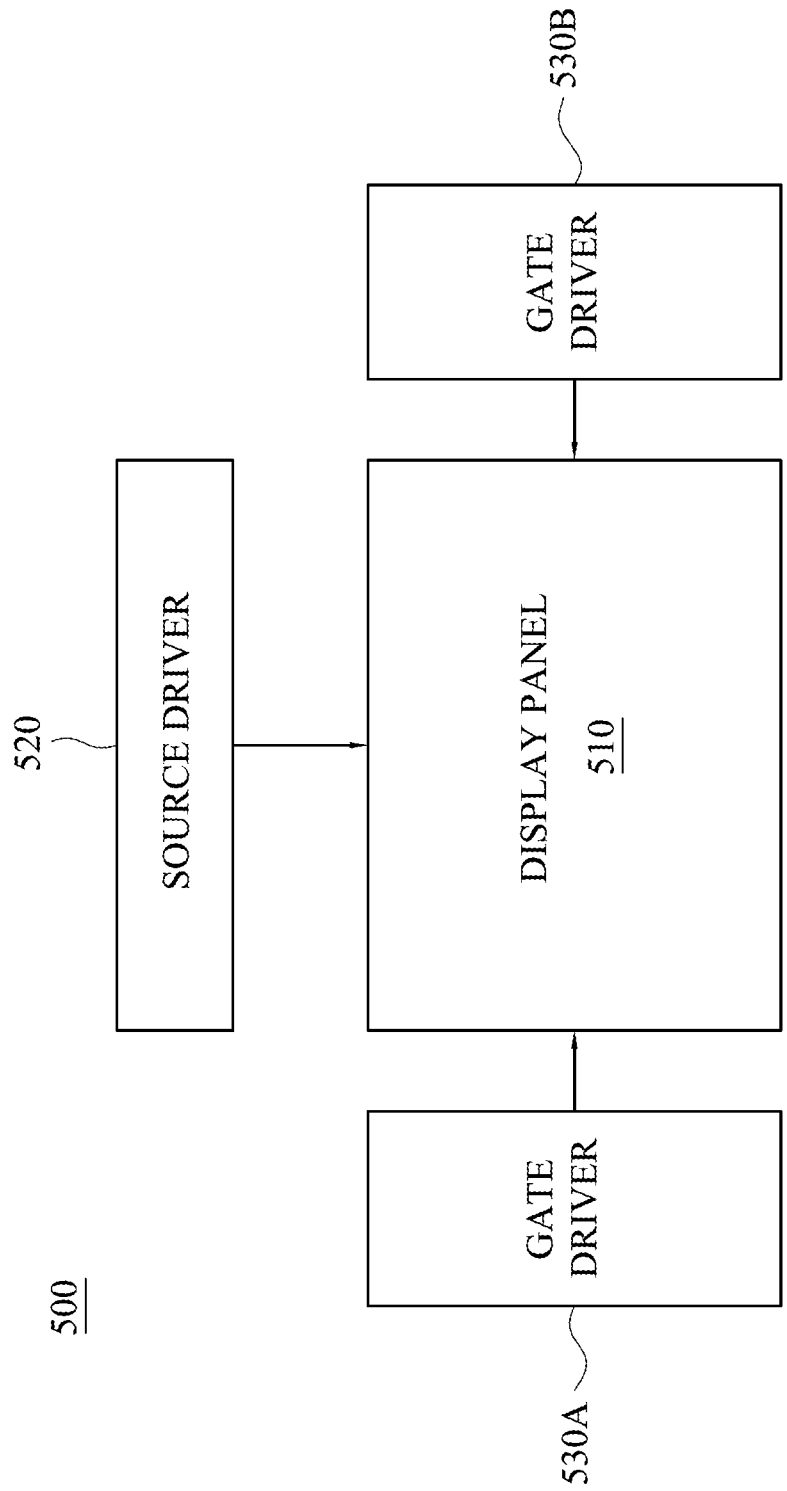
FIG. 5 is a schematic diagram of a display device.

Please refer to FIG. 5, which is a schematic diagram of a display device 500. The display device 500 includes a display panel 510, a source driver 520 and a gate driver 530. The display device 500 is similar to the display device 100 of FIG. 1. The difference between the display device 100 and the display device 500 is that the display device 500 includes two gate drivers 530A and 530B. As shown in FIG. 5, the gate drivers 530A and 530B are disposed at the left and right sides of the display panel 510, respectively, and collectively transmit gate driving signals to the display panel 510. In another embodiment, the disposal of the gate drivers 530A and 530B may be adjusted in accordance with various design requirements. The display panel 510 and the source driver 520 are approximately the same as the display panel 110 and the source driver 120 of FIG. 1, respectively, and the description is not described again herein.

Figure 6:
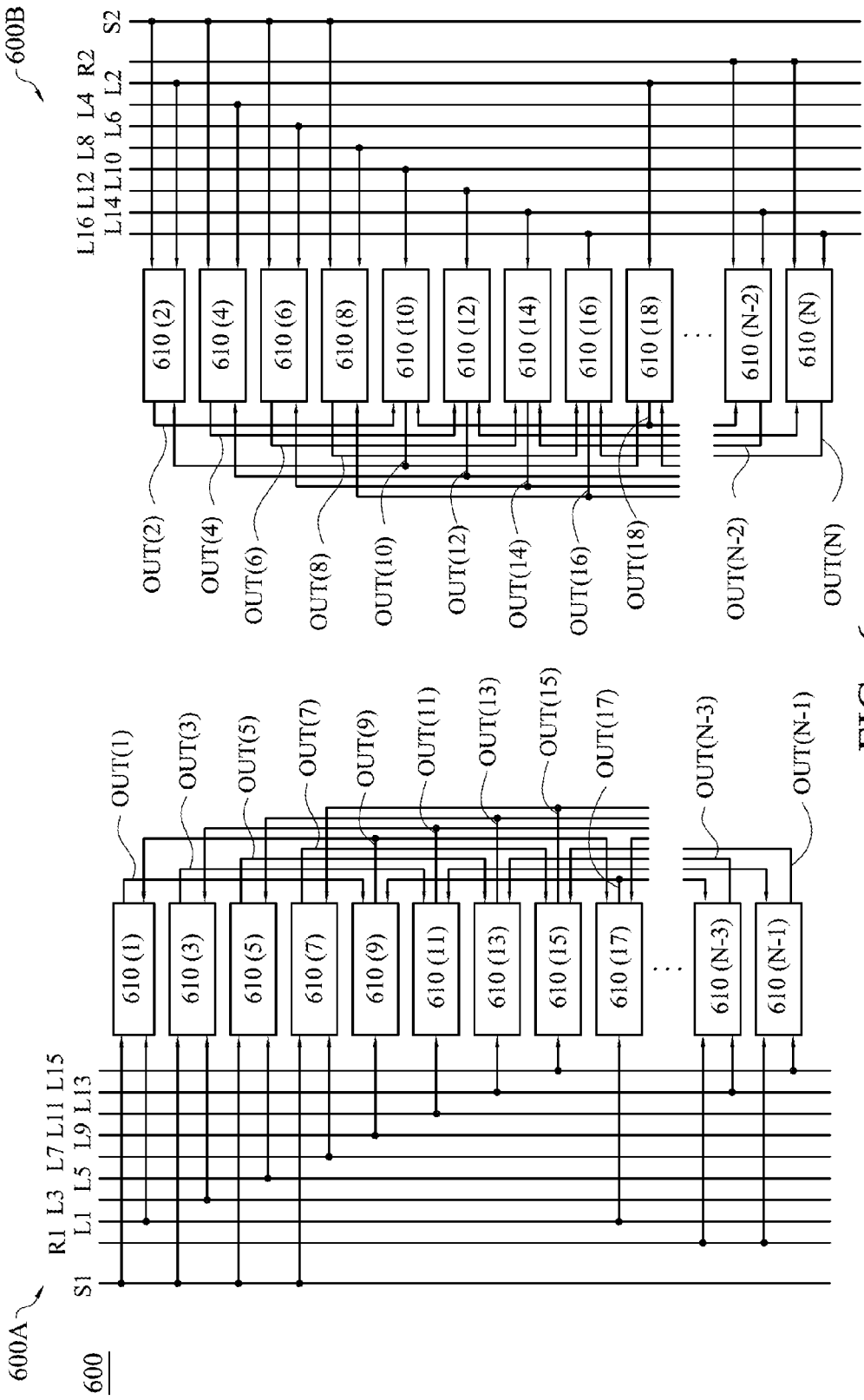
FIG. 6 is a schematic diagram of a gate driving circuit in accordance with a third embodiment of the present invention.

Please refer to FIG. 6, which is a structure diagram of a driving circuit 600 in accordance with a third embodiment of the present invention. The driving circuit 600 is adapted to the display device 500 of FIG. 5 or other similar display device. In the following, the display device 500 of FIG. 5 is exemplified for description. The driving circuit 600 includes gate driving circuits 600A and 600B which are respectively a part of the gate drivers 530A and 530B. The gate driving circuit 600A includes clock signal lines L1, L3, L5, L7, L9, L11, L13 and L15, a start signal line S1, an ending signal line R1 and odd-numbered stage shift registers 610(1), 610(3), . . . , 610(N-1), and the gate driving circuit 600B includes clock signal lines L2, L4, L6, L8, L10, L12, L14 and L16, a starting signal line S2, an ending signal line R2 and even-numbered stage shift registers 610(2), 610(4), . . . , 610(N), where N is an integer greater than or equal to 17. In some embodiments, N is a multiple of 16. The clock signal lines L1-L16 are configured to provide clock signals C1-C16 to the shift registers 610(1)-610(N), respectively. In FIG. 6, the clock signal lines L1-L16 respectively provide the clock signals C1-C16 to the corresponding shift registers 610(1)-610(N). In addition, the starting signal line S1 provides a starting signal STV1 to the $1^{st}$ $3^{rd}$, $5^{th}$ and $7^{th}$ stage shift register 610(1), 610(3), 610(5) and 610(7); the starting signal line S2 provides a starting signal STV2 to the $2^{nd}$, $4^{th}$ $6^{th}$ and $8^{th}$ stage shift register 610(2), 610(4), 610(6) and 610(8); the ending signal line R1 provides an ending signal RSTV1 to the $(N-7)^{th}$, $(N-5)^{th}$, $(N-3)^{th}$ and $(N-1)^{th}$ stage shift register 610(N-7), 610(N-5), 610(N-3) and 610(N-1); and the ending signal line R2 provides an ending signal RSTV2 to the $(N-6)^{th}$, $(N-4)^{th}$, $(N-2)^{th}$ and $N^{th}$ stage shift registers 610(N-6), 610(N-4), 610(N-2) and 610(N). The shift registers 610(1)-610(N) generate output signals OUT(1)-OUT(N), respectively. The output signals OUT(1)-OUT(8) are respectively inputted to the $9^{th}$ to $16^{th}$ stage shift registers 610(9)-610(16), the output signals OUT(N-7)-OUT(N) are respectively inputted to the $(N-15)^{th}$ to $(N-8)^{th}$ stage shift registers 610(N-15)-610(N-8), and each of the other output signals OUT(9)-OUT(N-8) is inputted to the shift registers eighth previous thereto and eighth next thereto. For illustration, the output signal OUT(9) is inputted to the $1^{st}$ stage shift register 610(1) and the $17^{th}$ stage shift register 610(17).

Figure 7:
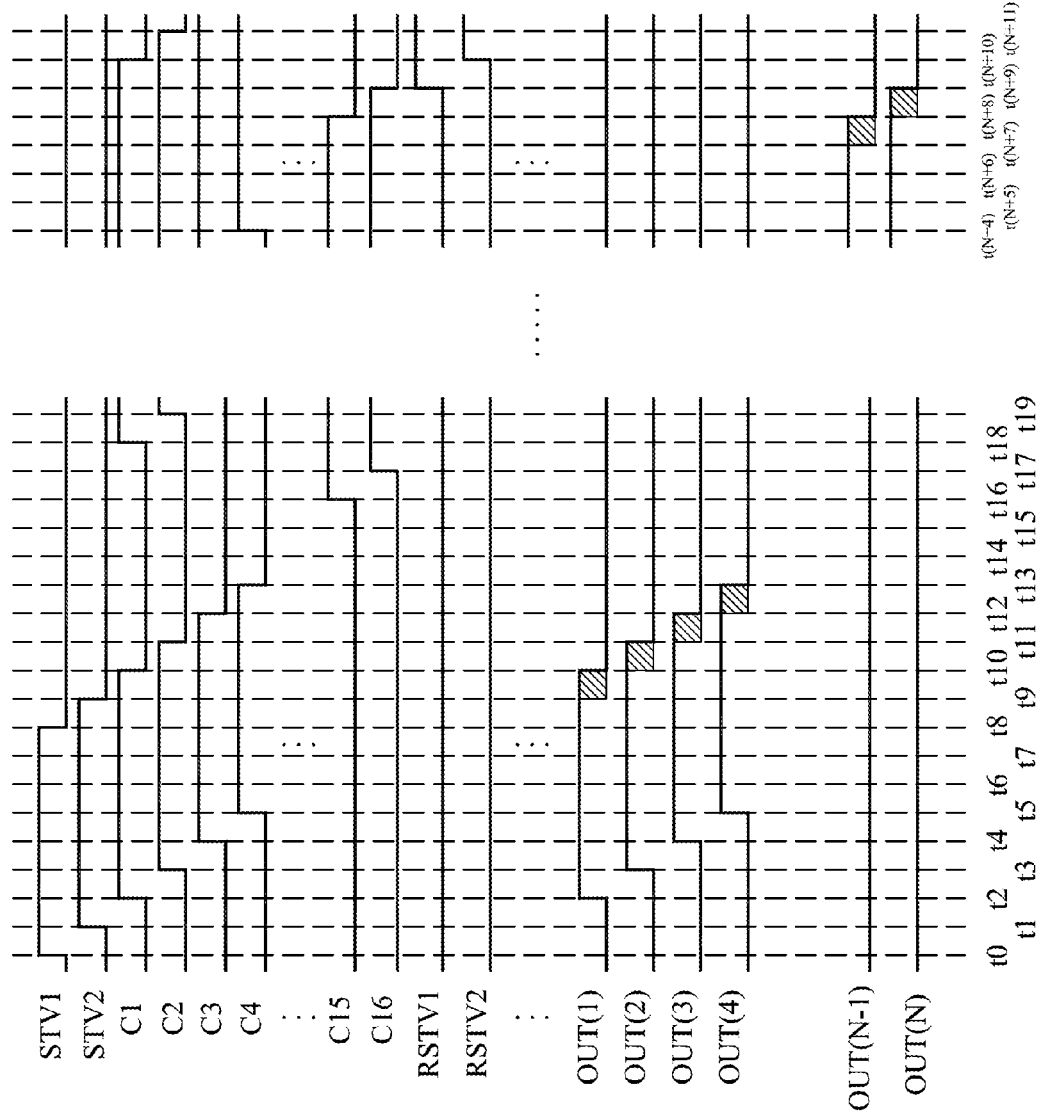
FIG. 7 is a time sequential diagram of the gate driving circuit of FIG. 6.

Please refer to FIG. 7, which is a time sequential diagram of the gate driving circuit 600 of FIG. 6. As shown in FIG. 7, the starting signals STV1 and STV2 sequentially rise to a high level at time points t0 and t1, and then the clock signals C1-C16 sequentially rise to a high level at time points t2-t17, such that the output signals OUT(1)-OUT(16) sequentially rise to a high level at time points t2-t17. The clock signals C1-C16 sequentially fall to a low level at time points t10-t25, such that the output signals OUT(1)-OUT(16) sequentially fall to a low level at time points t10-t25. The clock signals C1-C16 have the same clock period, and the high level duration and the low level duration in each clock period are the same. The clock signal C2 lags the clock signal C1 by $\frac{1}{16}$ clock period, the clock signal C3 lags the clock signal C2 by $\frac{1}{16}$ clock period, and the like. The output signals OUT(1)-OUT(N) respectively switch to a high level and a low level at particular time points in accordance with the aforementioned rule for driving corresponding pixels of the display panel 510. Last, the ending signals RSTV1 and RSTV2 rise to a high level at time points t(N+9) and t(N+10), respectively, and the current driving stage ends.

In FIG. 7, for each of the output signals OUT(1)-OUT(N), the duration for driving the display panel 110 (the shaded part in FIG. 7) occupies $\frac{1}{8}$ of the high level duration. Similar to the gate driving circuit 200, in the embodiment of the gate driving circuit 600, the output signals OUT(1)-OUT(N)

have longer pre-charge time, and thus the driving efficiency of the gate driving circuits 600A and 600B to the display panel can be enhanced. In addition, the driving circuit 600 can reduce the resistance and the capacitance of the clock signal lines L1-L16 by half, and the RC loading is reduced accordingly, thereby improving driving efficiency and reducing delay and power consumption due to the RC loading.

Summing up the above, for the gate driving circuit and the display device of the present invention, the output signals of the shift registers have longer pre-charge time, and thus the driving efficiency to the display panel can be enhanced. In addition, the gate driving circuit and the display device of the present invention also reduce the RC loading of the clock signal lines in the gate driving circuit, thereby improving driving efficiency and reducing delay and power consumption due to the RC loading.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A gate driving circuit, comprising:
   first to eighth clock signal lines configured to provide first to eighth clock signals, respectively; and
   first $1^{st}$ to $N^{th}$ stage shift registers, wherein the first $i^{th}$ stage shift register of the first shift registers is coupled to one of the first to eighth clock signal lines, and the first $i^{th}$ stage shift register receives one of the first to eighth clock signals, a first input signal and a second input signal and outputs a first $i^{th}$ stage output signal;
   wherein, when i is any integer from 5 to (N−4), the first input signal is a first $(i-4)^{th}$ stage output signal outputted by the first $(i-4)^{th}$ stage shift register, and the second input signal is a first $(i+4)^{th}$ stage output signal outputted by the first $(i+4)^{th}$ stage shift register;
   wherein N is an integer greater than or equal to 9, and i is any integer from 1 to N.

2. The gate driving circuit of claim 1, wherein, when i is any integer from 1 to 4, the first input signal is a starting signal, and the second input signal is a first $(i+4)^{th}$ stage output signal outputted by the first $(i+4)^{th}$ stage shift register.

3. The gate driving circuit of claim 1, wherein, when i is any integer from (N−3) to N, the first input signal is a first $(i-4)^{th}$ stage output signal outputted by the first $(i-4)^{th}$ stage shift register, and the second input signal is an ending signal.

4. The gate driving circuit of claim 1, wherein the first to eighth clock signals have substantially the same clock period, a high level duration and a low level duration in the clock period are substantially the same, and the $(j+1)^{th}$ clock signal of the first to eighth clock signals lags the $j^{th}$ clock signal of the clock signals by substantially ⅛ clock period, wherein j is an integer less than 8.

5. The gate driving circuit of claim 1, wherein N is a multiple of 8.

6. The gate driving circuit of claim 1, further comprising:
   ninth to sixteenth clock signal lines configured to provide the first to eighth clock signals, respectively; and
   second $1^{st}$ to $N^{th}$ stage shift registers, wherein the second $i^{th}$ stage shift register of the second shift registers is coupled to one of the ninth to sixteenth clock signal lines, and the second $i^{th}$ stage shift register receives one of the first to eighth clock signals, a third input signal and a fourth input signal and outputs a second $i^{th}$ stage output signal;
   wherein the second $i^{th}$ stage output signal is substantially the same as the first $i^{th}$ stage output signal.

7. The gate driving circuit of claim 6, wherein, when i is any integer from 1 to 4, the third input signal is a starting signal, and the fourth input signal is a second $(i+4)^{th}$ stage output signal outputted by the second $(i+4)^{th}$ stage shift register.

8. The gate driving circuit of claim 6, wherein, when i is any integer from 5 to (N−4), the third input signal is a second $(i-4)^{th}$ stage output signal outputted by the second $(i-4)^{th}$ stage shift register, and the fourth input signal is a second $(i+4)^{th}$ stage output signal outputted by the second $(i+4)^{th}$ stage shift register.

9. The gate driving circuit of claim 6, wherein, when i is any integer from (N−3) to N, the third input signal is a second $(i-4)^{th}$ stage output signal outputted by the second $(i-4)^{th}$ stage shift register, and the fourth input signal is an ending signal.

10. A display device, comprising:
    a display panel having a first side and a second side opposite to each other; and
    a driving circuit configured to drive the display panel, the driving panel comprising:
    first to sixteenth clock signal lines configured to provide first to sixteenth clock signals, respectively; and
    $1^{st}$ to $N^{th}$ stage shift registers, wherein the $i^{th}$ stage shift register of the shift registers is coupled to one of the first to sixteenth clock signal lines, and the $i^{th}$ stage shift register receives one of the first to sixteenth clock signals, a first input signal and a second input signal and outputs an $i^{th}$ stage output signal;
    wherein the driving circuit are divided into a first gate driving circuit and a second gate driving circuit, the first gate driving circuit has the odd-numbered clock signal lines of the first to sixteenth clock signal lines and the odd-numbered stage shift registers of the first to $N^{th}$ stage shift registers, the second gate driving circuit has the even-numbered clock signal lines of the first to sixteenth clock signal lines and the even-numbered stage shift registers of the first to $N^{th}$ stage shift registers, the first gate driving circuit and the second gate driving circuit are disposed at the first side and the second side of the display panel, respectively, N is an integer greater than or equal to 17, and i is any integer from 1 to N.

11. The display device of claim 10, wherein, when i is any integer from 1 to 8, the first input signal is a starting signal, and the second input signal is an $(i+8)^{th}$ stage output signal outputted by the $(i+8)^{th}$ stage shift register.

12. The display device of claim 10, wherein, when i is any integer from 9 to (N−8), the first input signal is an $(i-8)^{th}$ stage output signal outputted by the $(i-8)^{th}$ stage shift register, and the second input signal is an $(i+8)^{th}$ stage output signal outputted by the $(i+8)^{th}$ stage shift register.

13. The display device of claim 10, wherein, when i is any integer from (N−7) to N, the first input signal is an $(i-8)^{th}$ stage output signal outputted by the $(i-8)^{th}$ stage shift register, and the second input signal is an ending signal.

14. The display device of claim 10, wherein the first to sixteenth clock signals have substantially the same clock period, a high level duration and a low level duration in the clock period are substantially the same, and the $(j+1)^{th}$ clock signal of the first to sixteenth clock signals lags the $j^{th}$ clock signal of the clock signals by substantially 1/16 clock period, wherein j is an integer less than 16.

15. The display device of claim 10, wherein N is a multiple of 16.

* * * * *